(12) United States Patent
Anderson

(10) Patent No.: US 6,171,389 B1
(45) Date of Patent: Jan. 9, 2001

(54) METHODS OF PRODUCING DOPED SEMICONDUCTORS

(75) Inventor: Douglas G. Anderson, Vancouver, WA (US)

(73) Assignee: SEH America, Inc., Vancouver, WA (US)

( * ) Notice: Under 35 U.S.C. 154(b), the term of this patent shall be extended for 0 days.

(21) Appl. No.: 09/163,858

(22) Filed: Sep. 30, 1998

(51) Int. Cl.$^7$ .................................................... C30B 9/04
(52) U.S. Cl. ........................ 117/2; 117/3; 117/9; 438/391
(58) Field of Search ........................ 117/2, 3, 9; 422/245, 422/1; 438/317, 391

(56) References Cited

U.S. PATENT DOCUMENTS 4,133,704 * 1/1979 MacIver et al. ...................... 438/515
5,441,901 * 8/1995 Candelaria ............................ 438/317

* cited by examiner

*Primary Examiner*—Felisa Hiteshew
(74) *Attorney, Agent, or Firm*—Kolisch, Hartwell, Dickinson, McCormack & Heuser

(57) ABSTRACT

Methods for producing doped polycrystalline semiconductors and for producing doped monocrystalline semiconductors from predoped monocrystalline and polycrystalline semiconductors. The methods for producing doped polycrystalline semiconductors may include (1) providing a reactor for chemical vapor deposition, (2) creating a vapor within the reactor that includes a silicon compound and a preselected dopant, and (3) providing a substrate, exposed to the vapor, onto which the silicon and the dopant in the vapor are deposited to form doped polycrystalline silicon. The methods for producing doped monocrystalline semiconductors may include (1) selecting a first amount of a first semiconductor, the first semiconductor having a first concentration of the dopant, (2) selecting a second amount of a second semiconductor, and (3) using the first and second amounts to grow a monocrystalline semiconductor having a preselected concentration of the dopant.

22 Claims, 3 Drawing Sheets

METHODS OF PRODUCING DOPED SEMICONDUCTORS

CROSS-REFERENCES

The following references are incorporated herein by reference: (1) "Standard Practice for Conversion Between Resistivity and Dopant Density for Boron-Doped and Phosphorus-Doped Silicon," ASTM Designation F 723–82 (1987); and (2) "Crystal Fabrication," by Takao Abe, in VLSI Electronics: Microstructure Science, volume 12, pages 3–61 (1985).

TECHNICAL FIELD

The invention relates to semiconductors. More particularly, the invention relates to methods for producing doped polycrystalline semiconductors and to methods for producing doped monocrystalline semiconductors from pre-doped monocrystalline and polycrystalline semiconductors.

BACKGROUND OF THE INVENTION

In recent years, electronics has come to be dominated by semiconductor devices, which are found in the discrete devices and integrated circuits of computers, calculators, televisions, VCRs, radios, telephones, answering machines, wristwatches, cameras, and cars, among others. Semiconductor devices are formed from semiconductors, which are compounds having conductivities intermediate between those of the high-conductivity conductors and the low-conductivity insulators. Here, conductivity refers to a compound's ability to conduct electricity; compounds with greater conductivities are able to conduct greater amounts of electricity.

Semiconductors are important in part because their conductivity readily may be altered by the addition of certain foreign compounds. These foreign compounds are known as dopants, and the addition of these foreign compounds to semiconductors is known as doping.

Doping may be used to create two types of semiconductors: n-type semiconductors and p-type semiconductors. In n-type semiconductors, the dopant adds negative charge carriers, which typically comprise extra electrons. Examples of n-type dopants for silicon-based semiconductors include phosphorus (P), arsenic (As), and antimony (Sb). In p-type semiconductors, the dopant adds positive charge carriers, which typically comprise holes (or missing electrons). Examples of p-type dopants for silicon-based semiconductors include boron (B).

Although doping is essential to semiconductor technology, current doping methods suffer from a number of shortcomings. In particular, current doping methods involve doping monocrystalline semiconductors as they are produced from polycrystalline precursors. Doping monocrystalline semiconductors may involve frequent storing, weighing, and handling of dopant. This processing requires special equipment, which may be bulky and expensive. This processing also requires an operator, which may expose the operator to extremely toxic dopants, such as arsenic. Doping monocrystalline semiconductors also may involve loss or uneven distribution of dopant.

SUMMARY OF THE INVENTION

The present invention addresses these and other shortcomings by providing methods for producing doped polycrystalline semiconductors and methods for producing doped monocrystalline semiconductors from predoped monocrystalline and polycrystalline semiconductors. These methods may reduce or eliminate the need to store, weigh, and handle dopant during the production of doped monocrystalline semiconductors. These methods also may enhance the uniformity of dopant distribution.

In a first set of embodiments, the invention provides methods of forming doped polycrystalline silicon. One such method involves (1) providing a reactor for chemical vapor deposition, (2) creating a vapor within the reactor that includes a silicon compound and a preselected dopant, and (3) providing a substrate, exposed to the vapor, onto which the silicon and the dopant in the vapor are deposited to form doped polycrystalline silicon. Additional, related methods are described in the detailed description and claims.

In a second set of embodiments, the invention provides methods of forming a monocrystalline semiconductor having a preselected concentration of a dopant. One such method involves (1) selecting a first amount of a first semiconductor, the first semiconductor having a first concentration of the dopant, wherein the first concentration is higher than the preselected concentration, (2) selecting a second amount of a second semiconductor, and (3) using the first and second amounts to grow the monocrystalline semiconductor. The first and second amounts are selected so that the monocrystalline semiconductor has the preselected concentration of the dopant. Additional, related methods are described in the detailed description and claims.

The nature of the invention will be understood more readily after consideration of the drawings and the detailed description of the invention that follow.

DETAILED DESCRIPTION OF THE INVENTION

The present invention provides (1) methods for producing doped polycrystalline semiconductors and (2) methods for producing doped monocrystalline semiconductors from pre-doped monocrystalline and polycrystalline semiconductors.

Figure 1:
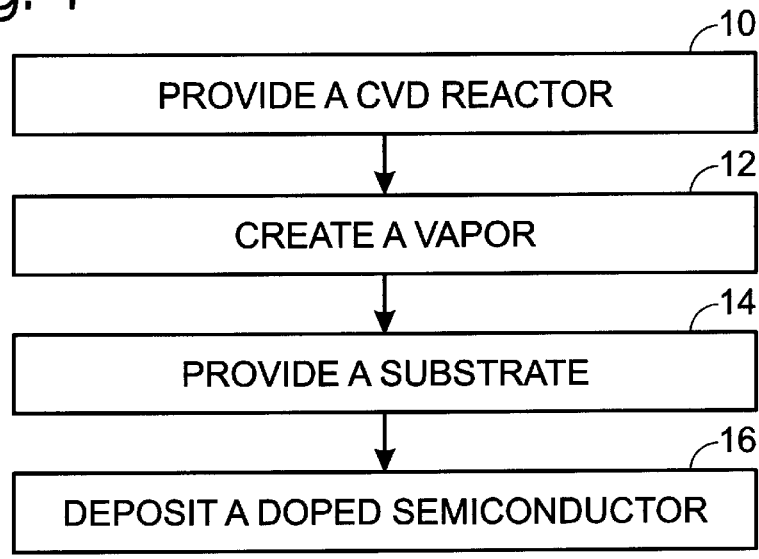
FIG. 1 is a flowchart showing a method for forming doped polycrystalline semiconductors.

FIG. 1 is a flowchart showing a method for forming doped polycrystalline silicon in accordance with the invention. Generally, doped polycrystalline silicon is formed by (1) providing a chemical vapor deposition (CVD) reactor 10, (2) creating a vapor 12 within the CVD reactor that includes a silicon compound and a preselected dopant, and (3) providing a substrate 14, exposed to the vapor, onto which the silicon and the dopant in the vapor are deposited 16 to form the doped polycrystalline silicon.

Figure 2:
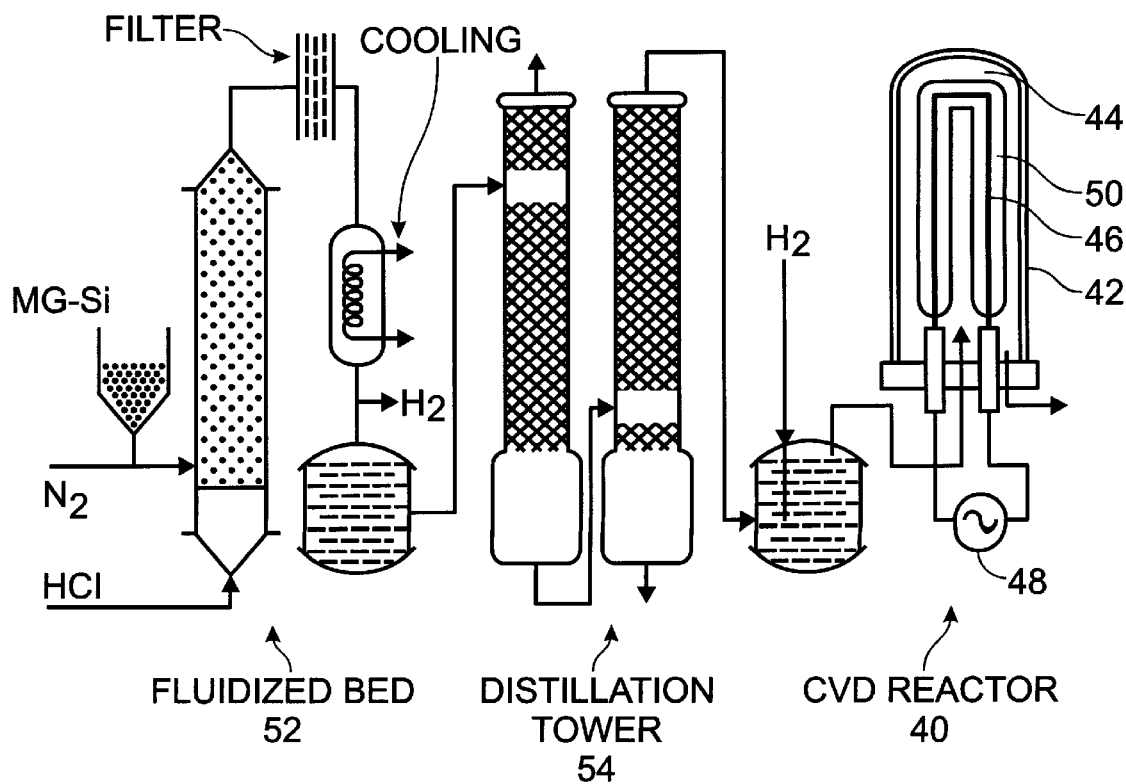
FIG. 2 is a schematic view of an apparatus for forming doped polycrystalline semiconductors.

FIG. 2 is a schematic view of an apparatus for forming doped polycrystalline silicon in accordance with the invention. The apparatus includes a CVD reactor 40, which in turn includes a reaction chamber 42 for enclosing a vapor 44 and a substrate 46 exposed to the vapor. Reaction chamber 42 may take various forms, including a quartz bell jar. Substrate 46 also may take various forms, including silicon. In CVD reactor 40, substrate 46 is connected to a power source 48, which may be used to create an electrical current within the substrate. This current is used to heat substrate 46 and vapor 44, which catalyzes a reaction in the vapor that leads to the deposition of doped polycrystalline silicon 50 onto substrate 46.

Vapor 44 is created within CVD reactor 40 from a silicon compound and a preselected dopant. The silicon compound may be monochlorosilane ($SiH_3Cl$), dichlorosilane ($SiH_2Cl_2$), trichlorosilane ($SiHCl_3$), and/or tetrachlorosilane ($SiCl_4$), among others. The dopant may be phosphine ($PH_3$), diborane ($B_2H_6$), and/or arsine ($AsH_3$), among others. A reductant, such as molecular hydrogen ($H_2$), also may be present.

In use, substrate 46 is heated to approximately 1100° C. The heat causes vapor 44 to undergo a reaction, which in turn causes doped polycrystalline silicon to deposit on substrate 46. If the reaction is maintained for 200–300 hours, deposits of doped polycrystalline silicon 150–200 mm in diameter may be formed. These deposits may be epitaxial, if substrate 46 is such that the doped polycrystalline silicon is deposited over the surface of another crystal of different chemical composition but similar structure.

FIG. 2 also shows a three-step method for producing trichlorosilane for use in the above method. In this three-step method, trichlorosilane is produced by (1) separating metallurgical-grade silicon (MG—Si) from quartzite ($SiO_2$) by a carbon reduction reaction in an arc furnace, (2) chlorinating MG—Si with HCl to produce trichlorosilane ($SiHCl_3$) in a fluidized bed reactor 52, and (3) purifying $SiHCl_3$ by distillation in a distillation tower 54.

Figure 3:
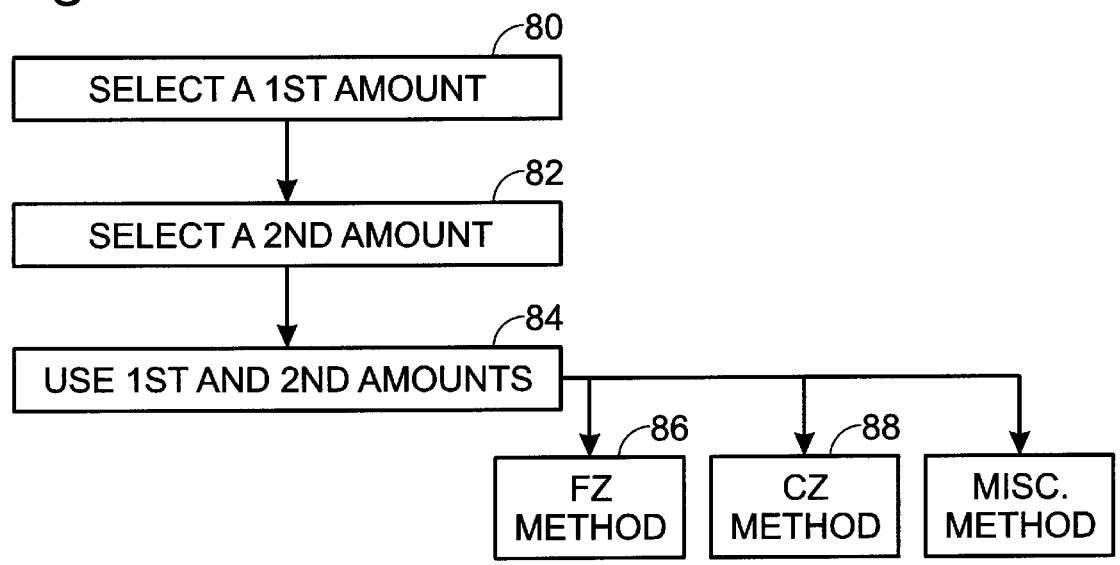
FIG. 3 is a flowchart showing a method for forming doped monocrystalline semiconductors.
Figure 4:
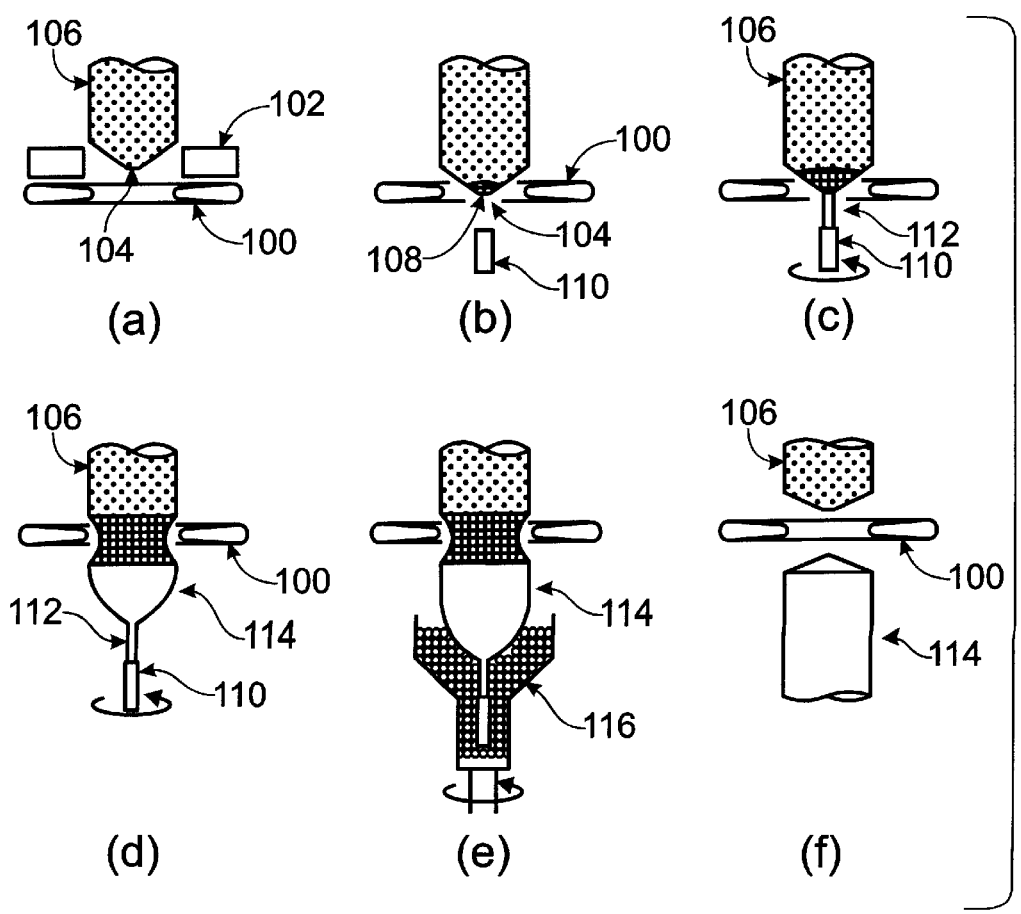
FIGS. 4a–4f is a schematic partial view of a floating zone (FZ) apparatus for forming doped monocrystalline semiconductors.

FIG. 3 is a flowchart of a method for forming doped monocrystalline semiconductors from predoped monocrystalline and/or polycrystalline semiconductors in accordance with the invention. The FZ method is the preferred method for producing semiconductor discrete devices. The CZ method is the preferred method for producing semiconductor integrated circuits. Generally, a doped monocrystalline semiconductor having a preselected concentration of a dopant may be formed by (1) selecting a first amount 80 of a predoped semiconductor having a first concentration of the dopant, wherein the first concentration is lower than the preselected concentration, (2) selecting a second amount 82 of the dopant, and (3) using the first and second amounts 84 to grow the monocrystalline semiconductor. The FZ method 86 is the preferred method of using the first and second amounts to produce semiconductor discrete devices. The CZ method 88 is the preferred method to produce semiconductor integrated circuits. The first and second amounts are selected so that the monocrystalline semiconductor has the preselected concentration of the dopant. The first and second semiconductors may be polycrystalline semiconductors, or they may be monocrystalline semiconductors.

Alternatively, a doped monocrystalline semiconductor having a preselected concentration of a dopant may be formed by (1) selecting a first amount of a first semiconductor, the first semiconductor having a first concentration of the dopant, wherein the first concentration is higher than the preselected concentration, (2) selecting a second amount of a second semiconductor, and (3) using the first and second amounts to grow the monocrystalline semiconductor.

Alternatively, a monocrystalline semiconductor that includes a preselected dopant may be formed by (1) selecting a polycrystalline semiconductor that includes the dopant, and (2) growing the monocrystalline semiconductor from the polycrystalline semiconductor. The polycrystalline semiconductor that includes a preselected dopant may be formed as described above. Typically, the concentration of dopant in the polycrystalline semiconductor should equal the desired concentration of dopant in the monocrystalline semiconductor, although additional dopant may be added during the FZ method.

FIGS. 4a–4f shows a schematic view of an FZ apparatus for forming doped monocrystalline semiconductors from predoped monocrystalline and/or polycrystalline semiconductors. As shown in Panel (a), the FZ apparatus includes a radio-frequency coil 100 and a conductive carbon ring 102. Radio-frequency coil 100 heats conductive carbon ring 102, which in turn heats a tip 104 of an oriented piece of predoped polycrystalline semiconductor 106. As shown in Panel (b), tip 104 melts when it reaches a sufficiently high temperature (e.g., 1427° C. for silicon), forming a conductive melt drop 108, which may directly be heated by radio-frequency coil 100. Melt drop 108 is brought into contact and fused with a monocrystalline seed crystal 110. As shown in Panel (c), seed crystal 110 may be rotated, and a neck 112 may be formed between seed crystal 110 and predoped polycrystalline semiconductor 106. As shown in Panel (d), seed crystal 110 then may be lowered slowly, so that predoped polycrystalline semiconductor 106 is pulled through radio-frequency coil 100, melted, and recrystallized as a monocrystalline semiconductor 114 continuous with neck 112 and seed crystal 110. As shown in Panel (e), a rotating support structure 116 may be employed to support the monocrystalline semiconductor 114 as it grows. As shown in Panel (f), the FZ method may be terminated by turning down radio-frequency coil 100 to reduce the quantity of the melt, and separating predoped polycrystalline semiconductor 106 from monocrystalline semiconductor 114.

Predoped polycrystalline semiconductors used in the FZ method preferably are free of cracks and other major discontinuities, and may be used to produce monocrystalline semiconductors of various diameters and resistivities. The pulling conditions can vary the diameter of the final monocrystalline semiconductor independent of the diameter of the starting polycrystalline semiconductor. For example, a 150-mm doped monocrystalline semiconductor may be grown from a 125-mm diameter predoped polycrystalline semiconductor.

Figure 5:
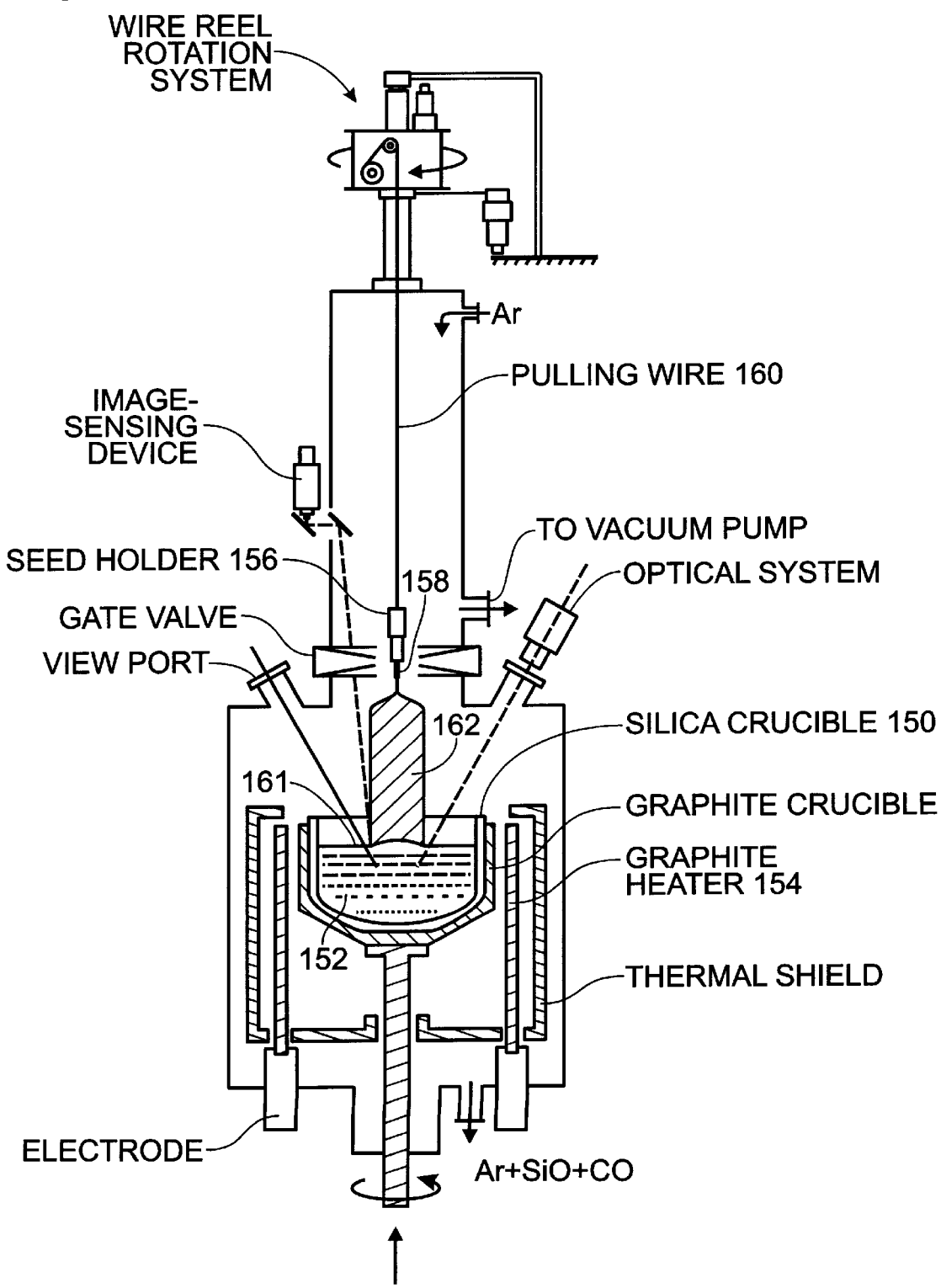
FIG. 5 is a schematic view of a Czochralski (CZ) apparatus for forming doped monocrystalline semiconductors.

FIG. 5 shows a schematic view of a (CZ) apparatus for forming doped monocrystalline semiconductors from predoped monocrystalline and/or polycrystalline semiconductors. The apparatus includes a crucible 150 for holding the predoped semiconductor 152 and a heater 154 for heating the crucible and semiconductor. The apparatus also includes a seed holder 156 for holding a monocrystalline seed crystal 158 and a pulling wire 160 attached to the seed holder for pulling the seed crystal away from crucible 150.

The CZ apparatus is used as follows. Heater 154 heats crucible 150 and predoped semiconductor 152 until predoped semiconductor 152 melts. Pulling wire 160 then lowers seed crystal 158 until it is immediately adjacent predoped semiconductor 152. When temperature conditions at the liquid/solid interface 161 are optimal, seed crystal 158 is touched to the surface and then slowly pulled away. Both the seed crystal and the crucible are in rotation, with the direction and speed of the rotation determined by the required crystal parameter. As seed crystal 158 slowly is pulled away, a conical/cylindrical monocrystalline semiconductor 162 forms as molten predoped semiconductor 152 solidifies. The crystal orientation of monocrystalline semiconductor 162 will be the same as that of seed crystal 158. The process is terminated when the desired charge, or length of crystal, is grown. Semiconductor 162 is then cooled and extracted from wire puller 156.

Typically, the crucible in the CZ method is made out of quartz ($SiO_2$), and a certain amount of the crucible dissolves into the molten semiconductor during crystal formation. In particular, oxygen from the crucible will be doped into monocrystalline semiconductor 162. Such oxygen has certain advantages, such as intrinsic gettering capabilities, but also certain disadvantages, such as an ability to migrate and form inhomogeneities.

The preselected concentration of dopant in both the FZ and CZ methods typically will be chosen so that the monocrystalline semiconductor has a preselected conductivity. The relationship between dopant concentration and conductivity depends on the dopant and on the semiconductor into which the dopant is added. Empirical relationships have been derived for various pairings; examples are given below both for a p-type semiconductor and an n-type semiconductor. These relationships are described in terms of resistivity, which is the multiplicative inverse of the conductivity.

Equation 1 describes the relationship between resistivity and concentration in boron-doped silicon, which is a p-type semiconductor.

$$n = \frac{1.330 \times 10^{16}}{\rho} + \frac{1.082 \times 10^{17}}{\rho[1 + (54.56\rho)^{1.105}]} \tag{1}$$

measured in atoms per cubic centimeter (atoms/$cm^3$). Table 1 shows concentrations derived from Eq. 1 for seven different resistivities.

TABLE 1

Example of groupings for a p-type semiconductor.

| Group | Resistivity [$\Omega$-cm] | Dopant Concentration [atoms/$cm^3$] | Dopant Concentration [atoms/g] | Mass [g] |
|---|---|---|---|---|
| A | 0 | $n_{s,1} = 0$ | $i_{s,1} = 0$ | $W_1$ |
| B | 0.005 | $n_{s,2} = 2.01396 \times 10^{19}$ | $i_{s,2} = 8.64359 \times 10^{18}$ | $W_2$ |
| C | 0.01 | $n_{s,3} = 8.48622 \times 10^{18}$ | $i_{s,3} = 3.64215 \times 10^{18}$ | $W_3$ |
| D | 0.06 | $n_{s,4} = 6.04728 \times 10^{17}$ | $i_{s,4} = 2.59540 \times 10^{17}$ | $W_4$ |
| E | 0.3 | $n_{s,5} = 6.00476 \times 10^{16}$ | $i_{s,5} = 2.57715 \times 10^{16}$ | $W_5$ |
| F | 2.0 | $n_{s,6} = 6.95122 \times 10^{15}$ | $i_{s,6} = 2.98336 \times 10^{15}$ | $W_6$ |
| G | 20.0 | $n_{s,7} = 6.67378 \times 10^{14}$ | $i_{s,7} = 2.86428 \times 10^{14}$ | $W_7$ |

Equation 2 describes the relationship between resistivity and concentration in phosphorous-doped silicon, which is an n-type semiconductor.

$$n = \frac{6.242 \times 10^{18}}{\rho} \times 10^Z \tag{2}$$

Here $$Z = \frac{A_0 + A_1 x + A_2 x^2 + A_3 x^3}{1 + B_1 x + B_2 x^2 + B_3 x^3} \tag{3}$$

$$x = \log_{10}\rho \tag{4}$$

$$A_0 = -3.1083 \tag{5a}$$

$$A_1 = -3.2626 \tag{5b}$$

$$A_2 = -1.2196 \tag{5c}$$

$$A_3 = -0.13923 \tag{5d}$$

$$B_1 = 1.0265 \tag{5e}$$

$$B_2 = 0.38755 \tag{5f}$$

$$B_3 = 0.041833 \tag{5g}$$

Again, resistivity is measured in $\Omega$-cm, and concentration is measured in atoms/$cm^3$. Table 2 shows concentrations derived from Eqs. 2–5 for seven different resistivities.

TABLE 2

Example of groupings for an n-type semiconductor.

| Group | Resistivity [$\Omega$-cm] | Dopant Concentration [atoms/$cm^3$] | Dopant Concentration [atoms/g] | Mass [g] |
|---|---|---|---|---|
| A | 0 | $n_{s,1} = 0$ | $i_{s,1} = 0$ | $W_1$ |
| B | 0.005 | $n_{s,2} = 1.22426 \times 10^{19}$ | $i_{s,2} = 5.25434 \times 10^{18}$ | $W_2$ |
| C | 0.01 | $n_{s,3} = 4.53266 \times 10^{18}$ | $i_{s,3} = 1.94535 \times 10^{18}$ | $W_3$ |
| D | 0.06 | $n_{s,4} = 1.74061 \times 10^{17}$ | $i_{s,4} = 7.47045 \times 10^{16}$ | $W_4$ |
| E | 0.3 | $n_{s,5} = 1.86957 \times 10^{16}$ | $i_{s,5} = 8.02392 \times 10^{15}$ | $W_5$ |
| F | 2.0 | $n_{s,6} = 2.33724 \times 10^{15}$ | $i_{s,6} = 1.00311 \times 10^{15}$ | $W_6$ |
| G | 20.0 | $n_{s,7} = 2.19207 \times 10^{14}$ | $i_{s,7} = 9.40801 \times 10^{13}$ | $W_7$ |

Monocrystalline semiconductors having a preselected concentration of a dopant may be formed from predoped monocrystalline or polycrystalline semiconductors from the groups in Tables 1 and 2, or from any other groups of predoped semiconductors, so long as the groups have dopant concentrations that bracket the preselected concentration. Generally, the dopant concentration in any monocrystalline semiconductor formed from any combination of predoped semiconductors is given by Eq. 6.

$$i_T = \left(\sum_j i_{s,j} W_j\right) / W_T \tag{6}$$

Here, $i_T$ is the dopant concentration in the monocrystalline semiconductor, $i_{sj}$ is the dopant concentration in the jth predoped semiconductor, $W_T$ is the mass or amount of the monocrystalline semiconductor, and $W_j$ is the mass or amount of the jth semiconductor. Eq. 6 may be used to derive expressions for the amount of predoped semiconductors that must be used to form a monocrystalline semiconductor having a preselected dopant concentration, which obtains whenever $i_T$ is specified. For example, if there are two predoped semiconductors, the following equations will apply:

$$i_T = (i_{s,u} W_u + i_{s,l} W_l) / W_T \tag{7}$$

$$W_T = W_u + W_l \tag{8}$$

Here, subscript u is for a first semiconductor, which has a dopant concentration higher than the preselected dopant concentration, subscript l is for a second semiconductor, which has a dopant concentration lower than the preselected dopant concentration, and subscript T is for the composite semiconductor. These equations may be solved for the first and second amounts $W_u$ and $W_l$, wherein the monocrystalline semiconductor has the preselected concentration, yielding:

$$W_u = \left(\frac{i_T - i_{s,1}}{i_{s,u} - i_{s,1}}\right) W_T \qquad (9)$$

$$W_1 = \left(\frac{i_T - i_{s,u}}{i_{s,1} - i_{s,u}}\right) W_T \qquad (10)$$

EXAMPLE 1

This example shows how the invention may be used to form a p-type monocrystalline boron/silicon semiconductor having a mass of 150 kilograms (kg) and a resistivity of 0.03 Ω-cm. Eq. 1 shows that the associated preselected dopant concentration is $n=1.77044 \times 10^{18}$ atoms/cm$^3$, or $7.59846 \times 10^{17}$ atoms/g.

Predoped semiconductors may be chosen from any group of p-type predoped semiconductors having dopant concentrations that bracket the preselected concentration, such as those in Table 1. For example, groups "C" and "D" may be chosen because they most closely bracket the preselected concentration. Eqs. 9 and yield a charge of 83.13 kg for group "D" and 66.87 kg for group "C," respectively. If these amounts are rounded to the nearest kg, such as 83 kg of group "D" and 67 kg of group "C," the error in the final resistivity would be about +1.2%. Alternatively, groups "B" and undoped "A" also may be chosen, because they also bracket the preselected concentration, although not as closely as groups "C" and "D." Eqs. 9 and 10 yield a charge of 30.673 kg of group "B" and 119.327 kg of undoped group "A." If these amounts are rounded to the nearest half kg, such as 30.5 kg of group "B" and 119.5 kg of group "A", the error in the final resistivity would be about 1.7%.

EXAMPLE 2

This example shows how the invention may be used to form an n-type monocrystalline phosphorous/silicon semiconductor having a mass of 100 kg and a resistivity of 5 Ω-cm. Eqs. 2–4 show that the associated dopant concentration is $n=9.04553 \times 10^{14}$ atoms/cm$^3$, or $3.88220 \times 10^{14}$ atoms/g. Predoped semiconductors may be chosen from any group of n-type predoped semiconductors having dopant concentrations that bracket the preselected concentration, such as those in Table 2. For example, groups "F" and "G" may be chosen. Eqs. 9 and 10 yield of charge of 10.842 kg of group "G" and 89.158 kg of group "F." If these amounts are rounded to the nearest kg, the error in the final resistivity would be about −1.1%.

These examples are intended to be illustrative and do not exhaust the flexibility of the associated methods. For example, the methods also may be used with a first amount of a predoped semiconductor and a second amount of a straight dopant, and with other combinations described in the claims. For critical specifications or epitaxial substrate applications, semiconductors may be predoped to the exact concentration preselected for the monocrystalline semiconductor.

Accordingly, while the invention has been disclosed in preferred forms, the specific embodiments thereof as disclosed and illustrated herein are not to be considered in a limiting sense, because numerous variations are possible and no single feature, function, or property of the preferred embodiments are essential. The invention is to be defined only by the scope of the issued claims.

I claim:

1. A method of forming a monocrystalline semiconductor, the method comprising:

selecting a desired final concentration of a dopant for the monocrystalline semiconductor, where the dopant is selected from the group consisting of antimony, arsenic, boron, and phosphorus;

selecting a first amount of a first semiconductor, the first semiconductor having a first concentration of the dopant, wherein the first concentration is higher than the desired final concentration of the dopant;

selecting a second amount of a second semiconductor; and using the first and second amounts to grow the monocrystalline semiconductor;

wherein the first amount of the first semiconductor and the second amount of the second semiconductor are selected so that the monocrystalline semiconductor has the desired final concentration of the dopant.

2. The method of claim 1, the second semiconductor having a second concentration of the dopant, wherein the second concentration is lower than the desired final concentration of the dopant.

3. The method of claim 1, wherein the first and second semiconductors are polycrystalline.

4. The method of claim 1, wherein the monocrystalline semiconductor includes silicon.

5. The method of claim 1, wherein the monocrystalline semiconductor includes gallium arsenate.

6. The method of claim 1, wherein the desired final concentration of the dopant is chosen to correspond to a preselected resistivity.

7. The method of claim 1, wherein the step of using the first and second amounts includes employing the Czochralski method.

8. The method of claim 1, wherein the dopant is selected from the group consisting of diborane ($B_2H_2$), phosphine ($PH_3$), and arsine ($AsH_3$).

9. The method of claim 1, wherein the monocrystalline semiconductor is a p-type semiconductor.

10. The method of claim 1, wherein the monocrystalline semiconductor is an n-type semiconductor.

11. The method of claim 1, wherein the dopant in the first and second semiconductors is a first dopant, further comprising:

selecting a third amount of a second dopant; and using the third amount together with the first and second amounts to grow the monocrystalline semiconductor;

wherein the first, second, and third amounts are selected so that the new semiconductor has the desired final concentration of the first dopant and a desired final concentration of the second dopant.

12. The method of claim 1, wherein the dopant in the first and second semiconductors is a first dopant, further comprising:

selecting a third amount of a third predoped semiconductor having a third concentration of a second dopant; and using the third amount together with the first and second amounts to grow the monocrystalline semiconductor;

wherein the first, second, and third amounts are selected so that the new semiconductor has the desired final concentration of the first dopant and a desired final concentration of the second dopant.

13. A method of forming a monocrystalline semiconductor, the method comprising:

selecting a desired final concentration of a dopant for the monocrystalline semiconductor, where the dopant is selected from the group consisting of antimony, arsenic, boron, and phosphorus;

selecting a first amount of a predoped semiconductor having a first concentration of the dopant, wherein the first concentration is lower than the desired final concentration of the dopant;

selecting a second amount of the dopant; and using the first and second amounts to grow the monocrystalline semiconductor;

wherein the first amount of the predoped semiconductor and the second amount of the dopant are selected so that the monocrystalline semiconductor has the desired final concentration of the dopant.

14. The method of claim 13, wherein the predoped semiconductor is polycrystalline.

15. The method of claim 13, wherein the step of using the first and second amounts includes employing the floating zone method.

16. A method of forming a monocrystalline semiconductor, the method comprising:

selecting a polycrystalline semiconductor that includes a dopant, where the dopant is selected from the group consisting of antimony, arsenic, boron, and phosphorus; and growing the monocrystalline semiconductor from the polycrystalline semiconductor by the Czochralski method or the floating zone method.

17. The method of claim 16, further comprising forming the polycrystalline semiconductor that includes the dopant by a chemical vapor deposition method.

18. A method of forming doped polycrystalline silicon, the method comprising:

providing a reactor for chemical vapor deposition;

creating a vapor within the reactor that includes a silicon compound and a dopant, where the dopant is selected from the group consisting of antimony, arsenic, boron, and phosphorus; and providing a substrate, exposed to the vapor, onto which the silicon and the dopant in the vapor are deposited to form doped polycrystalline silicon.

19. The method of claim 18, wherein the silicon compound includes at least one of the following: monochlorosilane, dichlorosilane, trichlorosilane, and tetrachlorosilane.

20. The method of claim 18, wherein the dopant is selected from the group consisting of diborane ($B_2H_2$), phosphine ($PH_3$), and arsine ($AsH_3$).

21. The method of claim 18, wherein the vapor also includes molecular hydrogen.

22. The method of claim 18, further comprising heating the substrate.

* * * * *